United States Patent
Zhang et al.

(10) Patent No.: US 12,016,204 B2
(45) Date of Patent: Jun. 18, 2024

(54) DISPLAY PANELS AND MANUFACTURING METHODS THEREOF AND DISPLAY APPARATUSES

(71) Applicants: MIANYANG BOE OPTOELECTRONICS TECHNOLOGY CO., Ltd., Mianyang (CN); BOE Technology Group Co., Ltd., Beijing (CN)

(72) Inventors: Zerui Zhang, Beijing (CN); Jenyu Lee, Beijing (CN); Haoyuan Fan, Beijing (CN); Zifeng Wang, Beijing (CN); Qicheng Chen, Beijing (CN)

(73) Assignees: MIANYANG BOE OPTOELECTRONICS TECHNOLOGY CO., LTD., Sichuan (CN); BOE Technology Group Co., Ltd., Beijing (CN)

( * ) Notice: Subject to any disclaimer, the term of this patent is extended or adjusted under 35 U.S.C. 154(b) by 487 days.

(21) Appl. No.: 17/345,813

(22) Filed: Jun. 11, 2021

(65) Prior Publication Data
US 2021/0408150 A1  Dec. 30, 2021

(30) Foreign Application Priority Data
Jun. 29, 2020 (CN) .......................... 202010611550.2

(51) Int. Cl.
*H10K 59/121* (2023.01)
*H10K 50/842* (2023.01)
(Continued)

(52) U.S. Cl.
CPC ....... *H10K 59/121* (2023.02); *H10K 50/8426* (2023.02); *H10K 50/865* (2023.02); *H10K 59/65* (2023.02); *H10K 71/00* (2023.02)

(58) Field of Classification Search
CPC ..................... H10K 59/121; H10K 59/40–70
See application file for complete search history.

(56) References Cited

U.S. PATENT DOCUMENTS

| 10,541,380 | B1* | 1/2020 | Sung ................. H10K 59/124 |
| 2019/0123115 | A1 | 4/2019 | Sun et al. |
| 2022/0029140 | A1 | 1/2022 | Wu et al. |

FOREIGN PATENT DOCUMENTS

| CN | 107658332 A | 2/2018 |
| CN | 109768188 A | 5/2019 |
| CN | 110405362 A | 11/2019 |

OTHER PUBLICATIONS

CN2020106115502 first office action.

* cited by examiner

*Primary Examiner* — Daniel P Shook
(74) *Attorney, Agent, or Firm* — IPro, PLLC

(57) ABSTRACT

A display panel, a manufacturing method thereof and a display apparatus are provided. In some embodiments, the display panel includes a substrate, pixel structures in an array, a protruding ring, an encapsulation layer, and solid sealant. The substrate includes a predetermined hole region, first adjacent region surrounding the hole region, second adjacent region surrounding the first adjacent region, and a display region surrounding the second adjacent region and in which the pixel structures are located. The protruding ring is located in the second adjacent region. The encapsulation layer covers the pixel structures and sides of the protruding ring away from the substrate. The protruding ring and the encapsulation layer covering the protruding ring form a dam. The solid sealant fills the first adjacent region and the hole region enclosed by the dam and is provided with an opening configured to release stress generated by the solid sealant during full curing.

19 Claims, 12 Drawing Sheets

(51) Int. Cl.
*H10K 50/86* (2023.01)
*H10K 59/65* (2023.01)
*H10K 71/00* (2023.01)

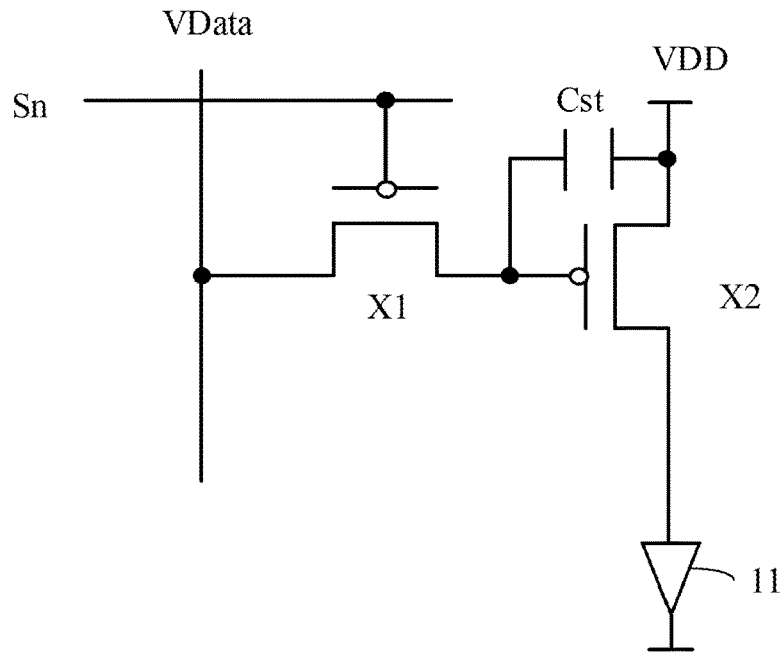

FIG. 3

| Provide a substrate, where the substrate comprises a predetermined hole region, a first adjacent region surrounding the predetermined hole region, a second adjacent region surrounding the first adjacent region, and a display region surrounding the second adjacent region | S1 |

↓

| Form a plurality of pixel structures arranged in an array in the display region, and form a protruding ring in the second adjacent region | S2 |

↓

| Form an encapsulation layer on the pixel structures arranged in an array and on sides of the protruding ring that are away from the substrate, where the protruding ring and a part of the encapsulation layer covering the protruding ring form a dam | S3 |

↓

| Fill, with a semi-solid sealant, the first adjacent region and the predetermined hole region that are enclosed by the dam, form an opening in the semi-solid sealant, and fully cure the semi-solid sealant to form a solid sealant, where the opening is configured to release stress generated by the semi-solid sealant during full curing | S4 |

FIG. 4

DISPLAY PANELS AND MANUFACTURING METHODS THEREOF AND DISPLAY APPARATUSES

CROSS-REFERENCE TO RELATED APPLICATION

This application claims priority to Chinese Patent Application No. 2020106115502 entitled "DISPLAY PANEL AND MANUFACTURING METHOD THEREOF" filed on Jun. 29, 2020, the entire content of which is incorporated herein by reference.

TECHNICAL FIELD

The present application relates to the technical field of display devices, and in particular, to a display panel and a manufacturing method thereof and a display apparatus.

BACKGROUND

Increasing a size of a display screen without increasing an overall size of a display apparatus may increase the screen-to-body ratio of the display apparatus. Screen-to-body ratio is a parameter of interest in the industry.

Generally, various optical sensing elements such as a camera are to be installed on a front side of the display apparatus.

SUMMARY

A first aspect of the present application provides a display panel, including:
  a substrate, comprising a predetermined hole region, a first adjacent region surrounding the predetermined hole region, a second adjacent region surrounding the first adjacent region, and a display region surrounding the second adjacent region;
  a plurality of pixel structures arranged in an array and located in the display region;
  a protruding ring, located in the second adjacent region;
  an encapsulation layer, covering the pixel structures arranged in an array and sides of the protruding ring that are away from the substrate, wherein the protruding ring and a part of the encapsulation layer covering the protruding ring form a dam;
  a solid sealant, filling the first adjacent region and the predetermined hole region that are enclosed by the dam; and
  an opening, located in the solid sealant, and configured to release stress generated by the solid sealant during full curing.

Optionally, the opening is located in the predetermined hole region and the opening includes one or more openings.

Optionally, the opening is formed through an entire thickness or a partial thickness of the solid sealant.

Optionally, the first adjacent region is a closed ring surrounding the predetermined hole region, the second adjacent region is a closed ring surrounding the first adjacent region, and the display region is a closed ring surrounding the second adjacent region.

Optionally, the first adjacent region is anon-closed ring surrounding the predetermined hole region, the second adjacent region is a non-closed ring surrounding the first adjacent region, and the display region is a non-closed ring surrounding the second adjacent region.

Optionally, the display panel further includes:
  touch electrode layers, located on a side of the encapsulation layer that is away from the substrate; and
  a light shielding layer, located on a side of the solid sealant that is away from the substrate, wherein the light shielding layer and at least one of the touch electrode layers are located at a same layer.

Optionally, the solid sealant is obtained by fully curing a liquid sealant or a semi-solid sealant.

Optionally, the semi-solid sealant is a photosensitive material.

Optionally, the semi-solid sealant is obtained by semi-curing a liquid sealant.

Optionally, the substrate further includes a third adjacent region, the third adjacent region surrounds the second adjacent region, the display region surrounds the third adjacent region, the encapsulation layer further covers the third adjacent region, and the third adjacent region and/or the first adjacent region is provided with one or more isolation trenches; and
  wherein the one or more isolation trenches penetrate through a gate insulation layer, an interlayer dielectric layer and a passivation layer.

A second aspect of the present application provides a manufacturing method for a display panel, including:
  providing a substrate, wherein the substrate includes a predetermined hole region, a first adjacent region surrounding the predetermined hole region, a second adjacent region surrounding the first adjacent region, and a display region surrounding the second adjacent region;
  forming a plurality of pixel structures arranged in an array in the display region, and forming a protruding ring in the second adjacent region;
  forming an encapsulation layer on the pixel structures arranged in an array and on sides of the protruding ring that are away from the substrate, wherein the protruding ring and a part of the encapsulation layer covering the protruding ring form a dam; and
  filling, with a semi-solid sealant, the first adjacent region and the predetermined hole region that are enclosed by the dam, forming an opening in the semi-solid sealant, and fully curing the semi-solid sealant to form a solid sealant, wherein the opening is configured to release stress generated by the semi-solid sealant during full curing.

Optionally, the semi-solid sealant is obtained by semi-curing of a liquid sealant; and both the semi-curing and the full curing are heat curing, and a temperature during the full curing is higher than a temperature during the semi-curing.

Optionally, the semi-solid sealant is obtained by semi-curing of a liquid sealant; and the semi-curing is ultraviolet curing, and the full curing is heat curing.

Optionally, the substrate further includes a third adjacent region, the third adjacent region surrounds the second adjacent region, the display region surrounds the third adjacent region, and the encapsulation layer further covers the third adjacent region,
  wherein the method further includes:
  forming, in the first adjacent region and/or the third adjacent region, one or more isolation trenches that penetrate through a gate insulation layer, an interlayer dielectric layer and a passivation layer.

Optionally, the method further includes:
  forming touch electrode layers on a side of the encapsulation layer that is away from the substrate; and
  forming a light shielding layer on a side of the solid sealant that is away from the substrate;

wherein the light shielding layer and at least one of the touch electrode layers are located at a same layer.

Optionally, the opening is located in the predetermined hole region and the opening includes one or more openings.

Optionally, the opening is formed through an entire thickness or a partial thickness of the solid sealant.

Optionally, the first adjacent region is a closed ring surrounding the predetermined hole region, the second adjacent region is a closed ring surrounding the first adjacent region, and the display region is a closed ring surrounding the second adjacent region.

A third aspect of the present application provides a display apparatus, including:
a display panel, including:
  a substrate, including a predetermined hole region, a first adjacent region surrounding the predetermined hole region, a second adjacent region surrounding the first adjacent region, and a display region surrounding the second adjacent region;
  a plurality of pixel structures arranged in an array and located in the display region;
  a protruding ring, located in the second adjacent region;
  an encapsulation layer, covering the pixel structures arranged in an array and sides of the protruding ring that are away from the substrate, wherein the protruding ring and a part of the encapsulation layer covering the protruding ring form a dam;
  a solid sealant, filling the first adjacent region and the predetermined hole region that are enclosed by the dam; and
  an opening, located in the solid sealant, and configured to release stress generated by the solid sealant during full curing; and
one or more photosensitive elements disposed on a back side of the display panel and aligned with the predetermined hole region.

Optionally, the one or more photosensitive elements include at least one of a camera, a fingerprint sensor, or an infrared sensor.

BRIEF DESCRIPTION OF DRAWINGS

The accompanying drawings herein, which are incorporated into the specification and constitute a part of this specification, illustrate embodiments consistent with the present application and, together with the specification, serve to explain the principles of the present application.

FIG. 3 is a diagram of a pixel driving circuit of a 2T1C configuration;

FIG. 4 is a flowchart of a manufacturing method for a display panel according to an embodiment of the present application;

DETAILED DESCRIPTION

Exemplary embodiments are described in detail herein, and examples of the exemplary embodiments are shown in the accompanying drawings. When the following description involves the accompanying drawings, unless otherwise indicated, the same numerals in different accompanying drawings represent the same or similar elements. Implementations described in the following exemplary embodiments do not represent all implementations consistent with the present application. On the contrary, the implementations are merely examples of an apparatus and a method that are consistent with some aspects of the present application described in detail in the appended claims.

In order not to affect the screen-to-body ratio of the display apparatus, an opening may be formed in a display panel of the display apparatus, and then a camera is mounted on the back side of the display panel. The camera can capture an image through the opening.

Figure 1:
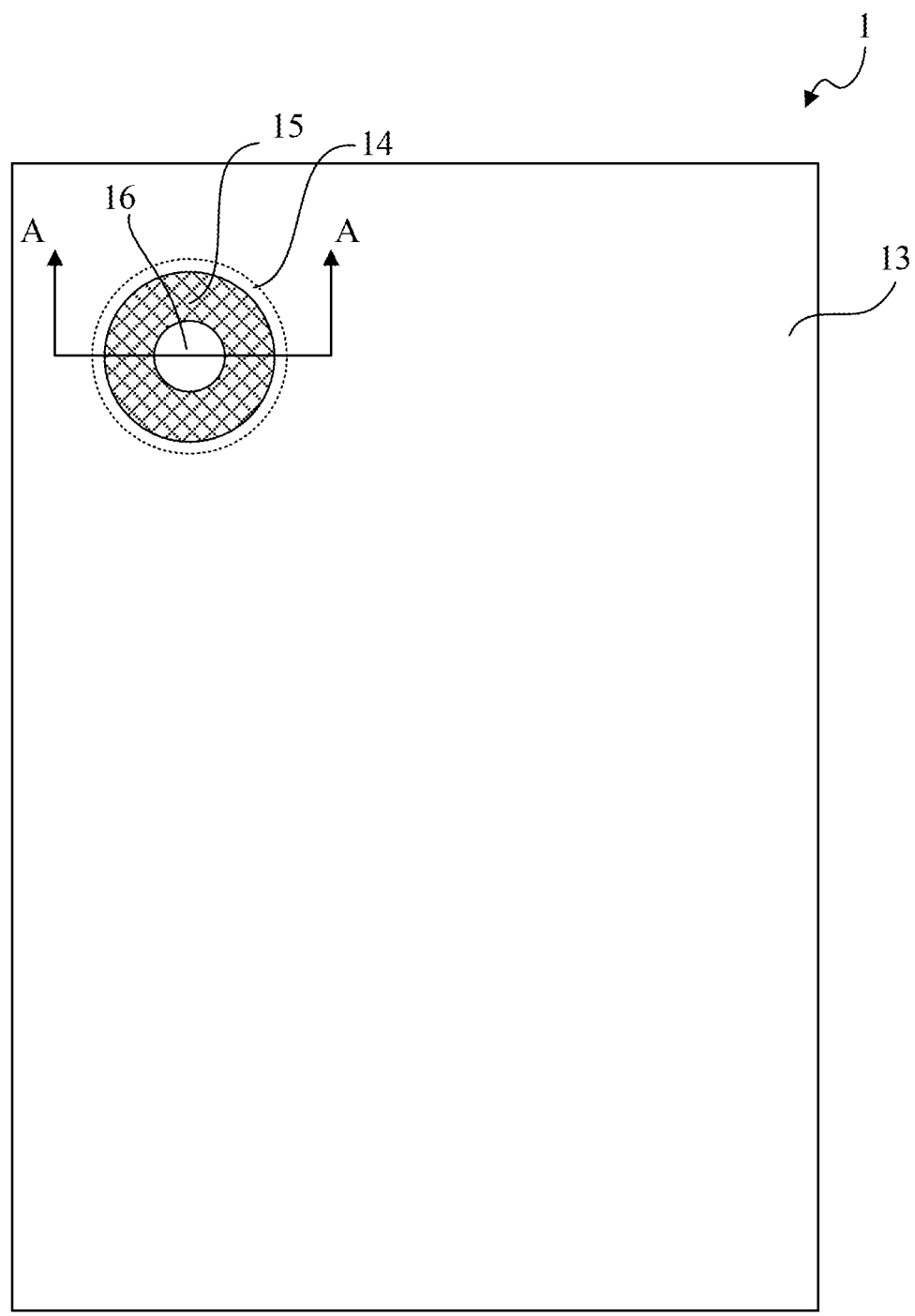
FIG. 1 is a schematic structural diagram of top view of a display panel according to an embodiment of the present application.
Figure 2:
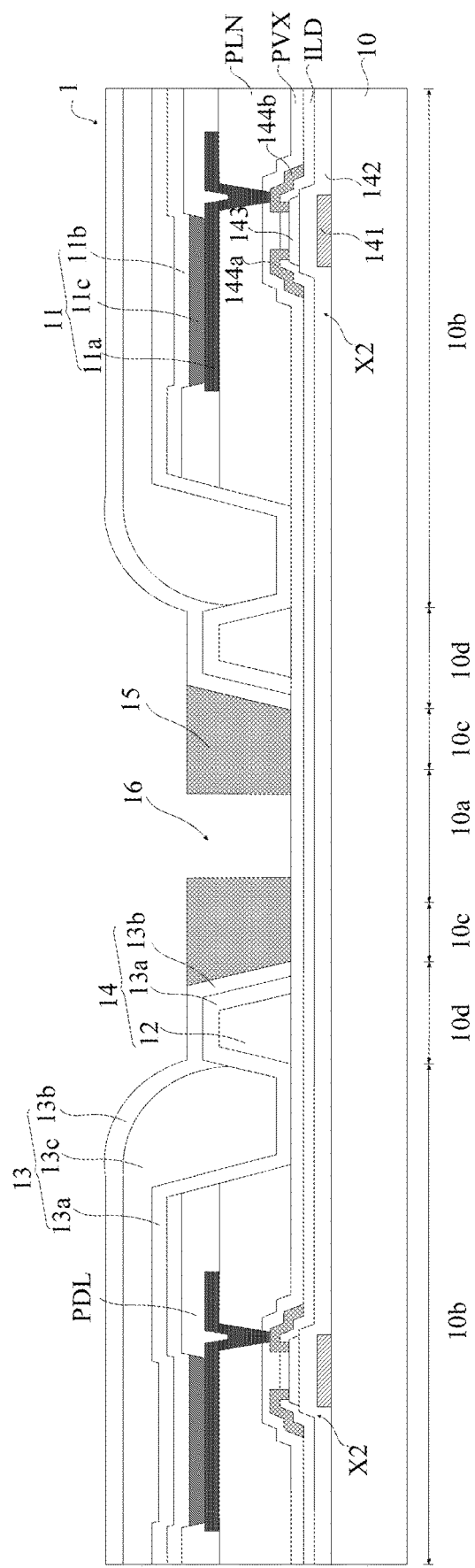
FIG. 2 is a cross-sectional view along a line AA in FIG. 1.

FIG. 1 is a schematic structural diagram of top view of a display panel according to an embodiment of the present application. FIG. 2 is a cross-sectional view along a line AA in FIG. 1.

Referring to FIG. 1 and FIG. 2, a display panel 1 includes:
  a substrate 10, including a predetermined hole region 10a, a first adjacent region 10c surrounding the predetermined hole region 10a, a second adjacent region 10d surrounding the first adjacent region 10c, and a display region 10b surrounding the second adjacent region 10d;
  a plurality of pixel structures 11 arranged in an array and located in the display region 10b;
  a protruding ring 12, located in the second adjacent region 10d;
  an encapsulation layer 13, covering the pixel structures 11 arranged in an array and sides of the protruding ring 12 that are away from the substrate 10, where the protruding ring 12 and a part of the encapsulation layer 13 covering the protruding ring 12 form a dam 14;
  a solid sealant 15, filling the first adjacent region 10c and the predetermined hole region 10a that are enclosed by the dam 14; and
  an opening 16, located inside the solid sealant 15, and configured to release stress generated during full curing of the solid sealant 15.

Referring to FIG. 1 and FIG. 2, the substrate 10 may be a flexible substrate or a rigid substrate. The material of a flexible substrate may be polyimide, and the material of a rigid substrate may be glass.

The predetermined hole region 10a is configured for being provided with a through hole or a blind hole, so that light can reach photosensitive elements such as a camera by passing through the through hole or the blind hole.

A planarization layer PLN is disposed on the display region 10b. A plurality of first electrodes 11a are disposed on a side of the planarization layer PLN that is away from the substrate 10. A pixel definition layer PDL is disposed on the first electrodes 11a and a part of the planarization layer PLN that is not covered by the first electrodes 11a. The pixel definition layer PDL is provided with a plurality of openings each exposing a partial region of the first electrode 11a, and a plurality of light-emitting blocks 11c are disposed inside the openings. A plurality of second electrodes 11b are disposed on the light-emitting blocks 11c and the pixel definition layer PDL.

Each of the light-emitting blocks 11c may be red, green, or blue; or may be red, green, blue, or yellow. Pixel structures 11 in three primary colors of red, green, and blue or in four primary colors of red, green, blue, and yellow are alternately distributed. The material of the light-emitting blocks 11c may be an organic light-emitting material.

Both the material of the planarization layer PLN and the material of the pixel definition layer PDL may be transparent materials such as polyimide.

The first electrodes 11a may be anodes, and the material thereof is a light transmitting material or a light reflecting material. The light transmitting material may be at least one of indium tin oxide (ITO), indium zinc oxide (IZO), and indium gallium zinc oxide (IGZO). Light reflecting material may include at least one of silver (Ag), Ag alloy, aluminum (Al), and Al alloy, for example, Ag, an alloy of Ag and lead (Pb) (Ag:Pb), an alloy of Al and neodymium (Nd) (Al:Nd), or an alloy of Ag, platinum (Pt), and copper (Cu) (Ag:Pt:Cu).

The second electrodes 11b may be cathodes, and the material thereof is a semi-transmitting and semi-reflecting material or a light reflecting material. The semi-transmitting and semi-reflecting material is a material having a property of partial light transmitting and partial light reflecting, for example, the semi-transmitting and semi-reflecting material includes at least one of magnesium (Mg), Ag, and Al, which may be a mixture of Mg and Ag or a mixture of Al and Ag. The light reflecting material may include at least one of Ag, Ag alloy, Al, and Al alloy, for example, Ag, an alloy of Ag and Pb (Ag:Pb), an alloy of Al and Nd (Al:Nd), or an alloy of Ag, Pt, and Cu (Ag:Pt:Cu).

When the material of the first electrodes 11a is a light transmitting material, and the material of the second electrodes 11b is a light reflecting material, the display panel 1 is of a bottom light-emitting structure; and when the material of the first electrodes 11a is a light reflecting material, and the material of the second electrodes 11b is a semi-transmitting and semi-reflecting material, the display panel 1 is of a top light-emitting structure. This is not limited in this embodiment.

In this embodiment, the second electrodes 11b may be connected as a planar electrode, to facilitate application of a voltage to the second electrodes 11b.

In this embodiment, the pixel structures 11 emit light in an active matrix (AM) light-emitting mode. Therefore, a pixel driving circuit is disposed between a first electrode 11a and the substrate 10.

FIG. 3 is a diagram of a pixel driving circuit of a 2T1C configuration. Referring to FIG. 3, the pixel driving circuit includes a switch transistor X1, a driving transistor X2, and a storage capacitor Cst.

A gate of the switch transistor X1 is electrically connected to a row scanning signal line. When the scanning signal Sn is a turn-on voltage, the switch transistor X1 keeps a data signal VData on a column data signal line on a plate of the storage capacitor Cst. When the scanning signal Sn is a turn-off voltage, the data signal kept on the storage capacitor Cst keeps the driving transistor X2 turned on, so that a power supply signal VDD on a column power supply signal line continuously supplies power to the first electrode 11a of a pixel structure 11.

Pixel driving circuits of pixel structures 11 in various colors located in the same row may be connected to the same row scanning signal line, and pixel driving circuits of pixel structures 11 in the same color located in the same column may be connected to the same column data signal line and the same column power supply signal line. In some embodiments, the storage capacitor Cst may be formed by overlapping regions between a power supply signal line and a gate of the driving transistor X2.

Referring to FIG. 2, in this embodiment, the driving transistor X2 in the pixel driving circuit includes: a bottom gate 141, a gate insulating layer 142, an active layer 143, an inter-layer dielectric layer ILD, a source 144a, a drain 144b, and a passivation layer PVX. Each layer in the switch transistor X1 and the same functional layer in the driving transistor X2 may be located at the same layer. In other words, the switch transistor X1 and the driving transistor X2 are of bottom gate structures.

The drain 144b of the switch transistor X1 and the source 144a of the driving transistor X2 may be connected by a conductive plug and a metal interconnect layer.

In some embodiments, one of the switch transistor X1 and the driving transistor X2 is of a bottom gate structure, and the other is of a top gate structure, or both the switch transistor X1 and the driving transistor X2 are of top gate structures.

In some embodiments, the pixel driving circuit of the pixel structure 11 may be a circuit structure in the related art such as a 3T1C circuit structure, a 5T2C circuit structure, a 6T1C circuit structure, or a 7T1C circuit structure. This is not limited in this embodiment.

In this embodiment, the gate insulating layer 142, the inter-layer dielectric layer ILD, and the passivation layer PVX extend to the first adjacent region 10c, the second adjacent region 10d, and the predetermined hole region 10a.

In some embodiments, the pixel structures 11 may alternatively emit light in a passive matrix (PM) mode.

The PM light-emitting mode is also referred to as a passive driving mode, in which rows of strip electrodes and columns of strip electrodes apply a voltage to the pixel structures 11 at the intersection of rows of strip electrodes and columns of strip electrodes, to cause the pixel structures to emit light. Therefore, there is no pixel driving circuit between the first electrode 11a and the substrate 10.

Referring to FIG. 2, the protruding ring 12 and the planarization layer PLN are located at the same layer, and the materials of the protruding ring 12 and the planarization layer PLN may be the same.

The encapsulation layer 13 may further be disposed on a side of each second electrode 11b that is away from the substrate 10. The encapsulation layer 13 may be a thin-film encapsulation (TFE) layer. The TFE layer may include a first inorganic encapsulation layer 13a close to the substrate 10, a second inorganic encapsulation layer 13b away from the substrate 10, and an organic encapsulation layer 13c between the first inorganic encapsulation layer 13a and the second inorganic encapsulation layer 13b.

The materials of the first inorganic encapsulation layer 13a and the second inorganic encapsulation layer 13b may include at least one of silicon oxide or silicon nitride.

The organic encapsulation layer 13c may include a polymer, for example, a single layer formed by at least one or a laminated layer formed by more than one of polyethylene terephthalate (PET), polyimide, polycarbonate, epoxy resin, polyethylene, and polyacrylic ester.

During deposition of the first inorganic encapsulation layer 13a and the second inorganic encapsulation layer 13b, the first inorganic encapsulation layer 13a and the second inorganic encapsulation layer 13b are also formed on the protruding ring 12.

The protruding ring 12 limits the organic encapsulation layer 13c in the display region 10b.

In some embodiments, the TFE layer may be of a stack structure of a plurality of layers of alternate organic and inorganic materials, to improve the encapsulation effect.

In some embodiments, a capping layer (CPL) may further be disposed between each second electrode 11b and the encapsulation layer 13.

The protruding ring 12 and the part of the encapsulation layer 13 covering the protruding ring 12 form the dam 14. The solid sealant 15 is bonded to a side of the dam 14 that is away from the display region 10b, to cut off, after a hole is provided in the predetermined hole region 10a, a path through which external water and oxygen enter the display region 10b from the hole.

The composition of the solid sealant 15 may be, for example, but not limited to, an acrylic acid material or an epoxy resin material.

The solid sealant 15 is obtained by fully curing a liquid sealant or a semi-solid sealant. During full curing, a large amount of contraction of the sealant leads to accumulation of stress, which causes a displacement of the dam 14. The displacement of the dam 14 leads to cracking or peeling of some layers (for example, the first electrode 11a, the light-emitting block Ic, or the second electrode 11b) of the pixel structure 11, affecting the display effect. For the foregoing problem, an opening 16 is provided in the solid sealant 15 in this embodiment, which can release stress generated during full curing, to avoid a displacement of the dam 14 caused by stress accumulation, thereby improving a yield of the display panel 1.

Referring to FIG. 2, in this embodiment, the opening 16 is located in the predetermined hole region 10a. Compared with the case that the opening 16 is located in the first adjacent region 10c, an advantage of this embodiment lies in that the solid sealant 15 has a better sealing effect after the opening is provided.

In addition, in this embodiment, the opening 16 is formed through an entire thickness of the solid sealant 15. In some embodiments, the opening 16 may alternatively be formed through a partial thickness of the solid sealant 15.

In this embodiment, the first adjacent region 10c is a closed ring surrounding the predetermined hole region 10a, the second adjacent region 10d is a closed ring surrounding the first adjacent region 10c, and the display region 10b is a closed ring surrounding the second adjacent region 10d.

Figure 13:
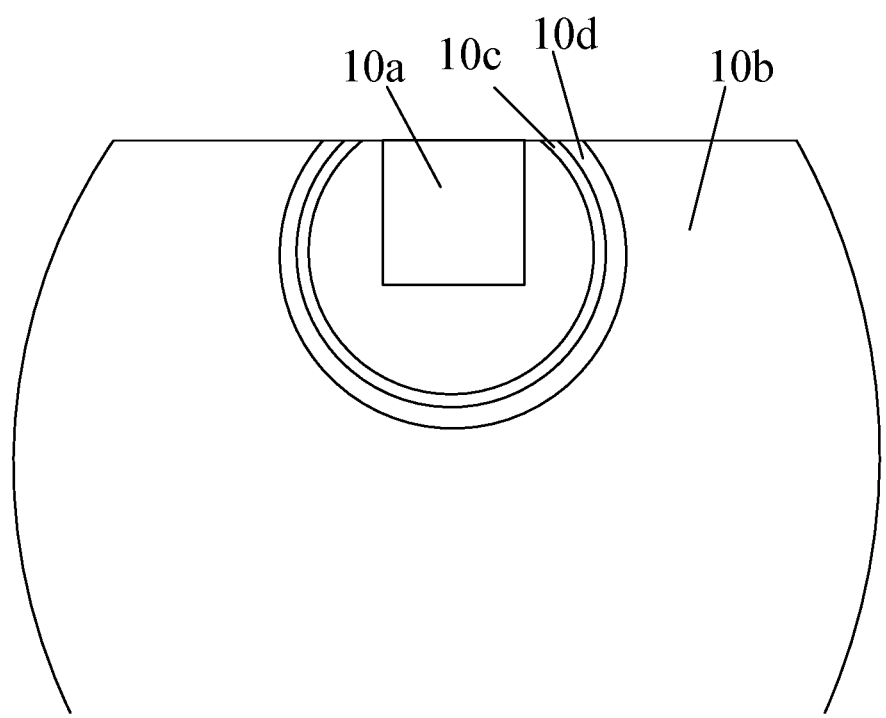
FIG. 13 is a schematic diagram of a structural relationship between a predetermined hole region, a display region, a first adjacent region, and a second adjacent region according to an embodiment of the present application.

In some embodiments, as shown in FIG. 13, for example, for a notch screen, the predetermined hole region 10a is fringe-shaped, and a side of the predetermined hole region 10a is located on an edge of the display region 10b. In this case, the first adjacent region 10c may be a non-closed ring surrounding the predetermined hole region 10a, the second adjacent region 10d is a non-closed ring surrounding the first adjacent region 10c, and the display region 10b is a non-closed ring surrounding the second adjacent region 10d.

In some embodiments, to improve the bonding effect of the solid sealant 15, the solid sealant 15 may further be bonded to a side of the dam 14 that is away from the substrate 10, and even be bonded to the encapsulation layer 13 on a side of the dam 14 that is close to the display region 10b.

Figure 5:
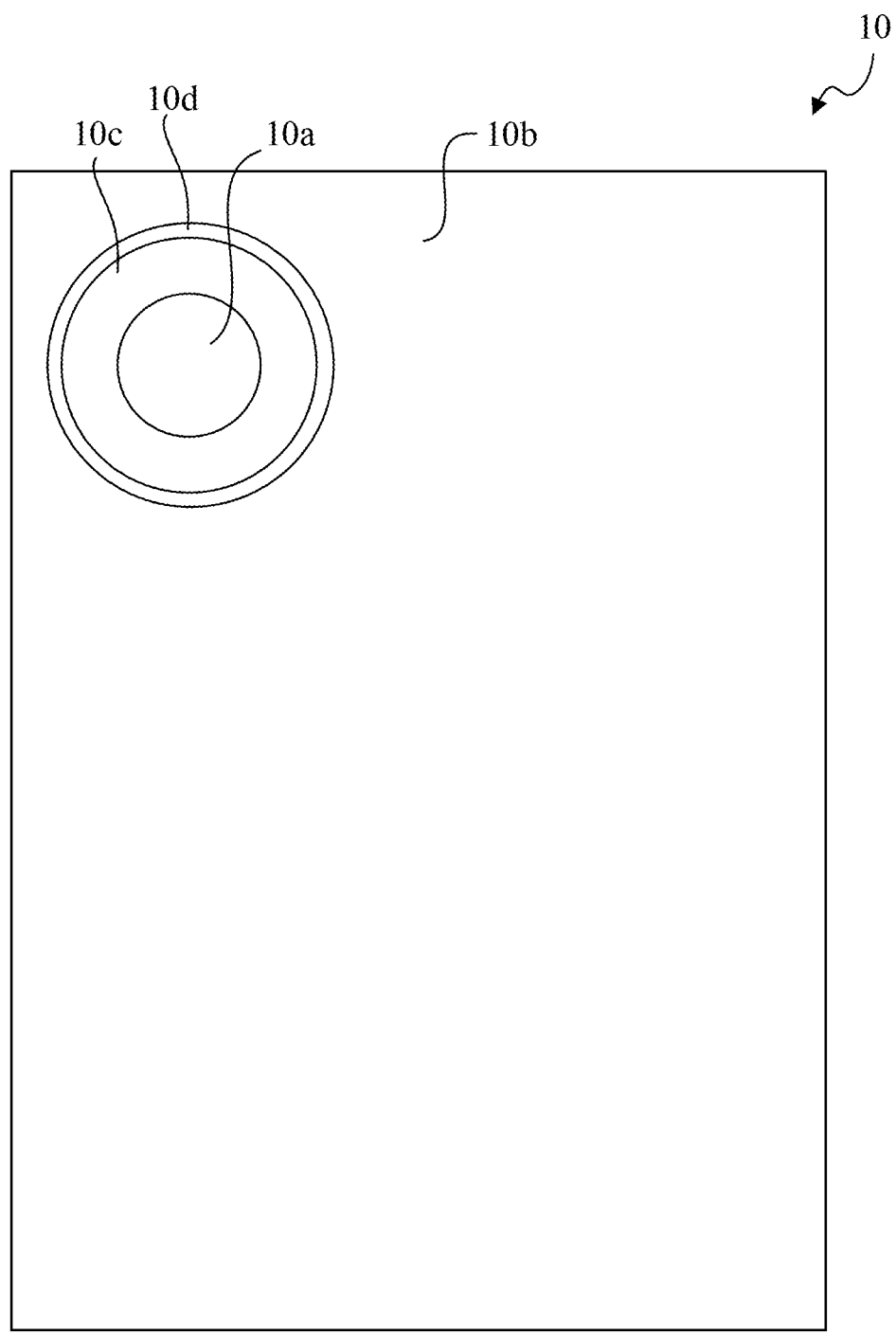
FIG. 5 to FIG. 8 are schematic diagrams of intermediate structures corresponding to processes of the method in FIG. 4.

For the display panel 1 in FIG. 1 and FIG. 2, embodiments of the present application further provide a manufacturing method. FIG. 4 is a flowchart of the manufacturing method. FIG. 5 to FIG. 8 are schematic structural diagrams of intermediate structures corresponding to processes of the method in FIG. 4;

First, referring to step S1 in FIG. 4 and FIG. 5, a substrate 10 is provided. The substrate 10 includes: a predetermined hole region 10a, a first adjacent region 10c surrounding the predetermined hole region 10a, a second adjacent region 10d surrounding the first adjacent region 10c, and a display region 10b surrounding the second adjacent region 10d.

The substrate 10 may be a flexible substrate or a rigid substrate. The material of a flexible substrate may be polyimide, and the material of a rigid substrate may be glass.

The predetermined hole region 10a is configured for being provided with a through hole or a blind hole, so that light can reach photosensitive elements such as a camera by passing through the through hole or the blind hole.

The display region 10b includes several pixel regions, and the pixel regions are distributed in an array in a row direction and a column direction.

Subsequently, referring to step S2 in FIG. 4, and FIG. 6 to FIG. 8, a plurality of pixel structures 11 arranged in an array is formed in the display region 10b, and a protruding ring 12 is formed in the second adjacent region 10d.

In this embodiment, the pixel structures 11 emit light in an AM light-emitting mode. The AM light-emitting mode is also referred to as an active driving mode, in which a pixel driving circuit applies a voltage to a pixel structure 11, so that the pixel structure 11 emits light. Therefore, a pixel driving circuit is first formed in a pixel region.

The pixel structures 11 are current-type devices, so that the pixel driving circuit includes several transistors and one or more storage capacitors. The following describes a manufacturing procedure of the pixel driving circuit still by using the 2T1C configuration in FIG. 3 as an example. Step S2 may include steps S21 to S24.

Figure 6:
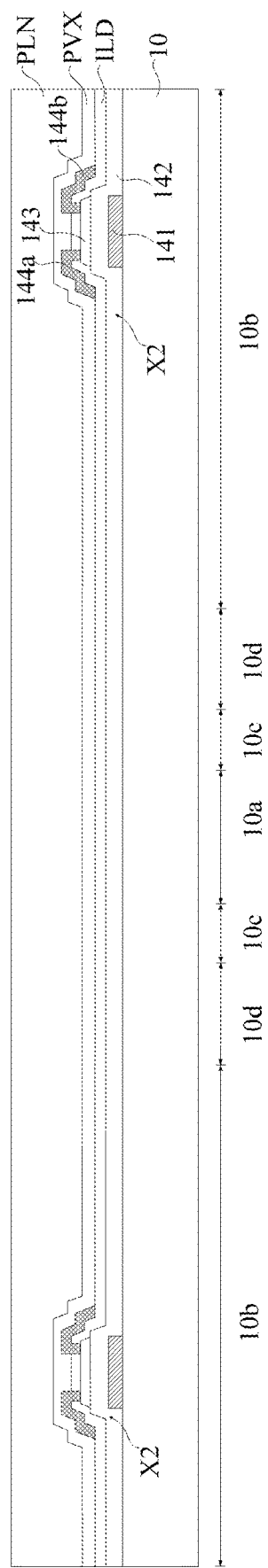

Step S21: Referring to FIG. 6, form a bottom gate 141 in a switch transistor region and a driving transistor region of the pixel region respectively; form, in the display region 10b, the first adjacent region 10c, the second adjacent region 10d, and the predetermined hole region 10a, a gate insulating layer 142 covering the bottom gates 141 and the substrate 10; form an active layer 143 (including a source region, a drain region, and a trench region between the source region and the drain region) in the switch transistor region and the driving transistor region respectively; form, in the display region 10b, the first adjacent region 10c, the second adjacent region 10d, and the predetermined hole region 10a, an inter-layer dielectric layer ILD covering the active layers 143 and the gate insulating layer 142; form, in the switch transistor region and the driving transistor region, a source 144a connected to the source region and a drain 144b connected to the drain region; form, in the display region 10b, the first adjacent region 10c, the second adjacent region 10d, and the predetermined hole region 10a, a passivation layer PVX covering the sources 144a, the drains 144b, and the inter-layer dielectric layer ILD; and form, in the switch transistor region and the driving transistor region, a conductive plug and a metal interconnect layer that connect the drain 144b of a switch transistor X1 and the source 144a of a driving transistor X2. The switch transistor region is a region in which a switch transistor is to be formed; and the driving transistor region is a region in which a driving transistor is to be formed.

In some embodiments, one of the switch transistor X1 and the driving transistor X2 is of a bottom gate structure, and the other is of a top gate structure, or both the switch transistor X1 and the driving transistor X2 are of top gate structures. The top gate structure means that a gate is farther away from the substrate 10 than the active layer 143.

Pixel driving circuits of pixel structures 11 located at the same row are connected to the same row scanning signal line, and pixel driving circuits of pixel structures 11 in the same color located at the same column are connected to the same column data signal line and the same column power supply signal line. The scanning signal line may be formed in the same procedure as the bottom gates 141. The data signal line and the power supply signal line may be formed in the same procedure as the source 144a/drain 144b. The storage capacitor Cst may be formed by overlapping regions between power supply signal lines and a gate of the driving transistor X2.

In some embodiments, the pixel driving circuit of the pixel structure 11 may be a circuit structure in the related art such as a 3T1C circuit structure, a 5T2C circuit structure, a 6T1C circuit structure, or a 7T1C circuit structure. This is not limited in this embodiment.

Step S22: Still referring to FIG. 6, form a planarization layer PLN on the metal interconnect layer and the passivation layer PVX.

The planarization layer PLN may be formed by using a coating method. The material of the planarization layer PLN may be a transparent material such as polyimide.

Figure 7:
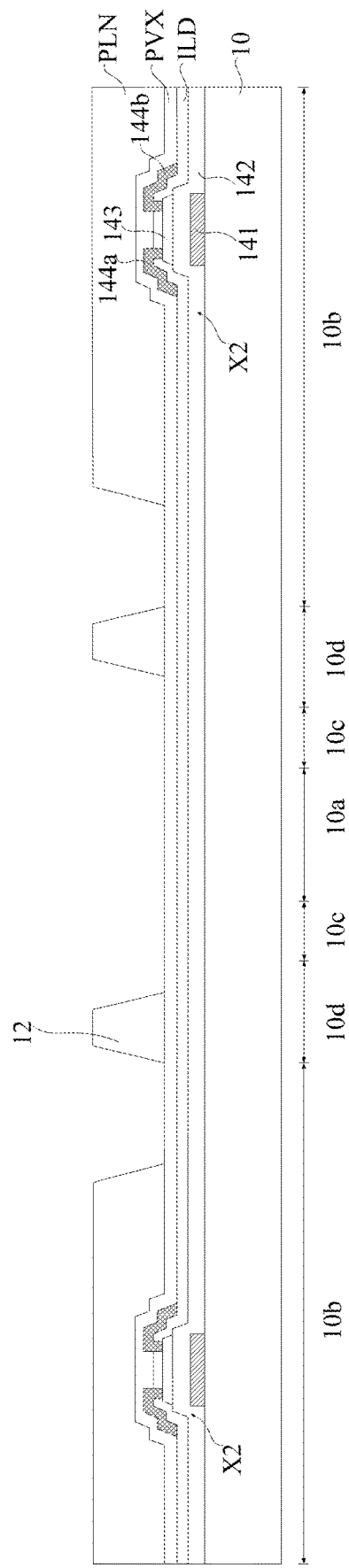

Step S23: Referring to FIG. 7, pattern the planarization layer PLN, to forma protruding ring 12 in the second adjacent region 10d, and remove the planarization layer PLN in the predetermined hole region 10a and the first adjacent region 10c.

The planarization layer PLN may be patterned by using a dry etching method or in a manner of first performing exposure and then performing development.

When forming the protruding ring 12, a part of the planarization layer PLN close to the display region 10b is also removed.

Figure 8:
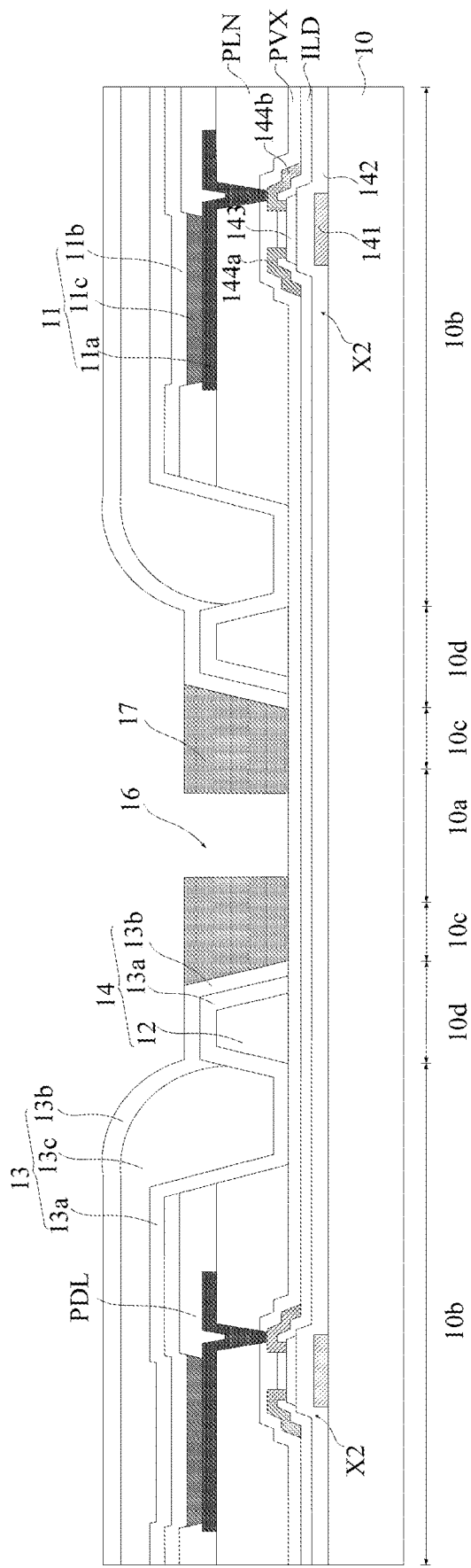

Step S24: Referring to FIG. 8, form a plurality of first electrodes 11a on a side of the planarization layer PLN in the display region 10b that is away from the substrate 10, where each pixel region has a first electrode 11a; form a pixel definition layer PDL on each first electrode 11a and on a side of the planarization layer PLN that is away from the substrate 10; form several openings in the pixel definition layer PDL, where each pixel region is provided with an opening; form a light-emitting block 11c in each opening; and form a second electrode 11b on each light-emitting block 11c and on a side of the pixel definition layer PDL that is away from the substrate 10.

An entire first electrode material layer may first be formed by using a deposition method, and then undergo dry etching or wet etching to form a plurality of first electrode blocks. The first electrodes 11a may be anodes, and the material thereof is a light transmitting material or a light reflecting material. The light transmitting material may be at least one of ITO, IZO, or IGZO. Light reflecting material may include at least one of Ag, Ag alloy, Al, or Al alloy, for example, Ag, an alloy of Ag and Pb (Ag:Pb), an alloy of Al and Nd (Al:Nd), or an alloy of Ag, Pt, and Cu (Ag:Pt:Cu).

The pixel definition layer PDL may be formed by using a coating method, and the openings may be formed by using an etching method. The material of the pixel definition layer PDL may be a transparent material such as polyimide.

The light-emitting blocks 11c may be formed by evaporating and depositing an organic light-emitting material layer by using an evaporation method. Organic light-emitting material layer in the first adjacent region 10c, the second adjacent region 10d, and the predetermined hole region 10a may be removed by using a laser ablation method.

The second electrodes 11b may be connected as a planar electrode. The second electrodes 11b may be cathodes, and the material thereof is a semi-transmitting and semi-reflecting material or a light reflecting material. The semi-transmitting and semi-reflecting material is a material having a property of partial light transmitting and partial light reflecting, for example, the semi-transmitting and semi-reflecting material includes at least one of magnesium (Mg), Ag, or Al, which may be a mixture of Mg and Ag or a mixture of Al and Ag. Light reflecting material may include at least one of Ag, Ag alloy, Al, or Al alloy, for example, Ag, an alloy of Ag and Pb (Ag:Pb), an alloy of Al and Nd (Al:Nd), or an alloy of Ag, Pt, and Cu (Ag:Pt:Cu).

In some embodiments, the pixel structure 11 may emit light in a passive matrix (PM) mode. For the pixel structure 11 in the PM mode, it is unnecessary to form a pixel driving circuit between the first electrode 11a and the substrate 10.

Subsequently, referring to step S3 in FIG. 4 and FIG. 8, an encapsulation layer 13 is formed on the pixel structures 11 arranged in an array and on sides of the protruding ring 12 that are away from the substrate 10, where the protruding ring 12 and a part of the encapsulation layer 13 covering the protruding ring 12 form a dam 14.

The encapsulation layer 13 may be a TFE layer. The TFE layer may include a first inorganic encapsulation layer 13a close to the substrate 10, a second inorganic encapsulation layer 13b away from the substrate 10, and an organic encapsulation layer 13c between the first inorganic encapsulation layer 13a and the second inorganic encapsulation layer 13b.

The first inorganic encapsulation layer 13a and the second inorganic encapsulation layer 13b may be formed by using a physical vapor deposition method or a chemical vapor deposition method. During deposition of the first inorganic encapsulation layer 13a and the second inorganic encapsulation layer 13b, the first inorganic encapsulation layer 13a and the second inorganic encapsulation layer 13b are also formed on the protruding ring 12. The organic encapsulation layer 13c may be formed by using an inkjet printing method. The protruding ring 12 limits the organic encapsulation layer 13c in the display region 10b.

In some embodiments, the TFE layer may alternatively be of a stack structure of a plurality of layers of alternate organic materials and inorganic materials, to improve the encapsulation effect.

In some embodiments, a capping layer (CPL) may further be disposed between each second electrode 11b and the encapsulation layer 13.

The protruding ring 12 and a part of the encapsulation layer 13 covering the protruding ring 12 form the dam 14.

Subsequently, referring to step S4 in FIG. 4 and FIG. 8, the first adjacent region 10c and the predetermined hole region 10a that are enclosed by the dam 14 are filled with a semi-solid sealant 17, and form an opening 16 in the semi-solid sealant 17; and the semi-solid sealant 17 is fully cured to form a solid sealant 15, where the opening 16 is configured to release stress generated by the semi-solid sealant 17 during full curing.

The semi-solid sealant 17 means that the sealant cannot flow freely.

In some embodiments, the semi-solid sealant 17 is obtained by partial curing of a liquid sealant. That is, step S4 includes: filling, with a liquid sealant, the first adjacent region 10c and the predetermined hole region 10a that are enclosed by the dam 14, and partially curing the liquid sealant to obtain the semi-solid sealant 17.

Both the partial curing and the full curing may be heat curing. A temperature during the full curing is higher than a temperature during the partial curing. That is, a degree of evaporation of a volatile solvent (which is water in some embodiments) during full curing is greater than a degree of evaporation of a volatile solvent during partial curing. Alternatively, the partial curing is ultraviolet curing, and the full curing is heat curing. In other words, an amount of the contraction caused by the full curing is greater than an amount of the contraction caused by the partial curing.

In some other embodiments, the semi-solid sealant 17 is a sealant known in the related art, and the semi-solid sealant 17 is filled in the first adjacent region 10c and the predetermined hole region 10a that are enclosed by the dam 14 by using a method such as coating.

In some embodiments, the material of the semi-solid sealant 17 may be a photosensitive material, and the opening 16 therein is formed in a manner of first performing exposure and then performing development.

In some other embodiments, the material of the semi-solid sealant 17 may be a material that can be removed through dry etching or a material that can be removed by using a laser, and the opening 16 therein is formed through dry etching or laser ablation.

After the semi-solid sealant 17 is fully cured, a solid sealant 15 is formed. The solid sealant 15 is bonded to a side of the dam 14 that is away from the display region 10b, to cut off, after a hole is provided in the predetermined hole region 10a, a path through which external water and oxygen enter the display region 10b from the hole.

Figure 9:
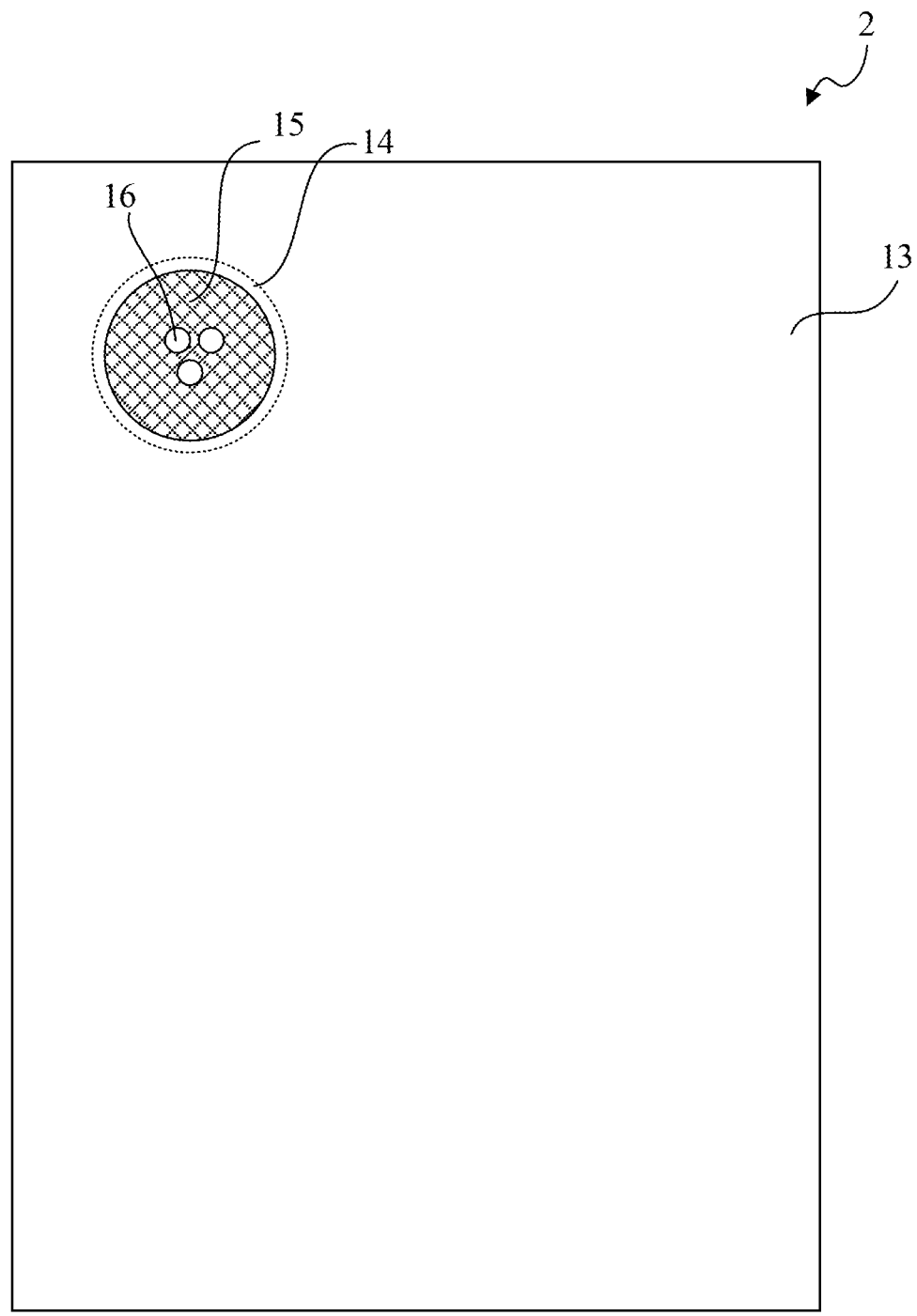
FIG. 9 is a schematic structural diagram of top view of a display panel according to another embodiment of the present application.

FIG. 9 is a schematic structural diagram of top view of a display panel according to another embodiment of the present application. Referring to FIG. 9, a display panel 2 and a manufacturing method thereof in this embodiment is substantially the same as the display panel 1 and the manufacturing method thereof in FIG. 1 to FIG. 8; and a difference lies in that: there are three openings 16.

In some embodiments, there may be two, four, or more openings 16. A plurality of openings 16 can further prevent stress from accumulation and superposition, and have a better stress-release effect.

Figure 10:
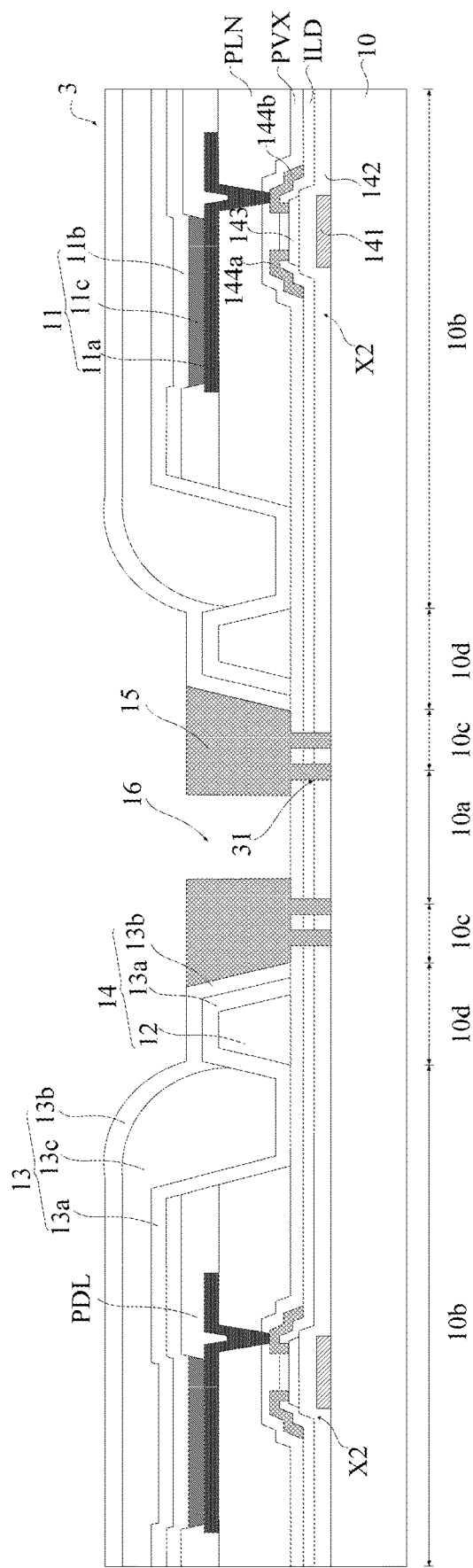
FIG. 10 is a schematic structural diagram of a cross section of a display panel according to yet another embodiment of the present application.
Figure 11:
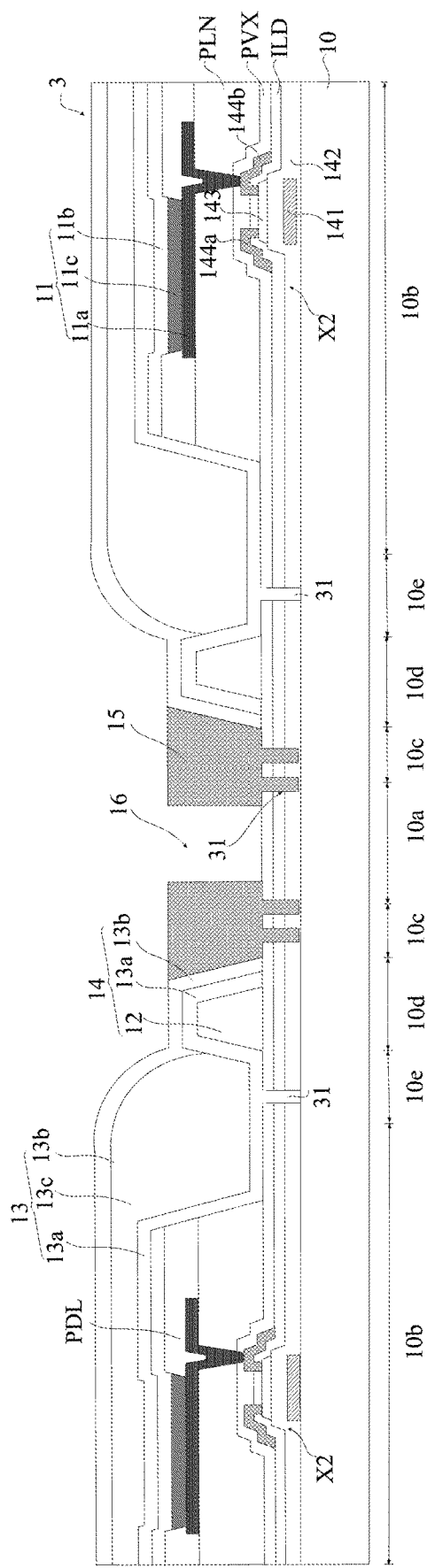
FIG. 11 is a schematic structural diagram of a cross section of a display panel according to still another embodiment of the present application.

FIG. 10 is a schematic structural diagram of a cross section of a display panel according to still another embodiment of the present application.

Referring to FIG. 10, a display panel 3 in this embodiment is substantially the same as the display panel 1 in FIG. 1 to FIG. 2 and the display panel 2 in FIG. 9, and a difference lies in that: the first adjacent region 10c is provided with one or more isolation trenches 31. The isolation trenches 31 penetrate through the gate insulating layer 142, the inter-layer dielectric layer ILD, and the passivation layer PVX.

In some embodiments, organic light-emitting material layer in the first adjacent region 10c, the second adjacent region 10d, and the predetermined hole region 10a is not removed. A function of the one or more isolation trenches 31 is that: they can isolate the organic light-emitting material layer in the first adjacent region 10c, and cut off a path through which water and oxygen enter the display region 10b. In addition, the one or more isolation trenches 31 cut off inorganic material layers such as the gate insulating layer 142, the inter-layer dielectric layer ILD, and the passivation layer PVX, and can prevent cracking of the inorganic material layers from extending to the display region 10b in a process in which an opening is provided in the predetermined hole region 10a.

When there are a plurality of isolation trenches 31, an isolation column is formed between adjacent isolation trenches 31.

In some embodiments, the substrate 10 may further include a third adjacent region 10e, the third adjacent region surrounds the second adjacent region 10d, and the display region 10b surrounds the third adjacent region. The encapsulation layer 13 further covers the third adjacent region. The protruding ring 12 limits the organic encapsulation layer 13c in the display region 10b and the third adjacent region.

The third adjacent region may also be provided with one or more isolation trenches 31, which are configured to cut off inorganic material layers such as the gate insulating layer 142, the inter-layer dielectric layer ILD, and the passivation layer PVX, and prevent cracking of the inorganic material layers from extending to the display region 10b in a process in which an opening is provided in the predetermined hole region 10a. In a case where the organic light-emitting material layer in the first adjacent region 10c, the second adjacent region 10d, and the predetermined hole region 10a is not removed, the one or more isolation trenches 31 are further configured to isolate an organic light-emitting material layer of the third adjacent region.

Correspondingly, the manufacturing method of the display panel 3 is basically the same as the methods in the above embodiments, and a difference lies in that: the following operation is performed in step S2 and between step S21 and S22: forming, in the first adjacent region 10c and/or the third adjacent region, one or more isolation trenches 31 that run through the gate insulating layer 142, the inter-layer dielectric layer ILD and the passivation layer PVX.

Figure 12:
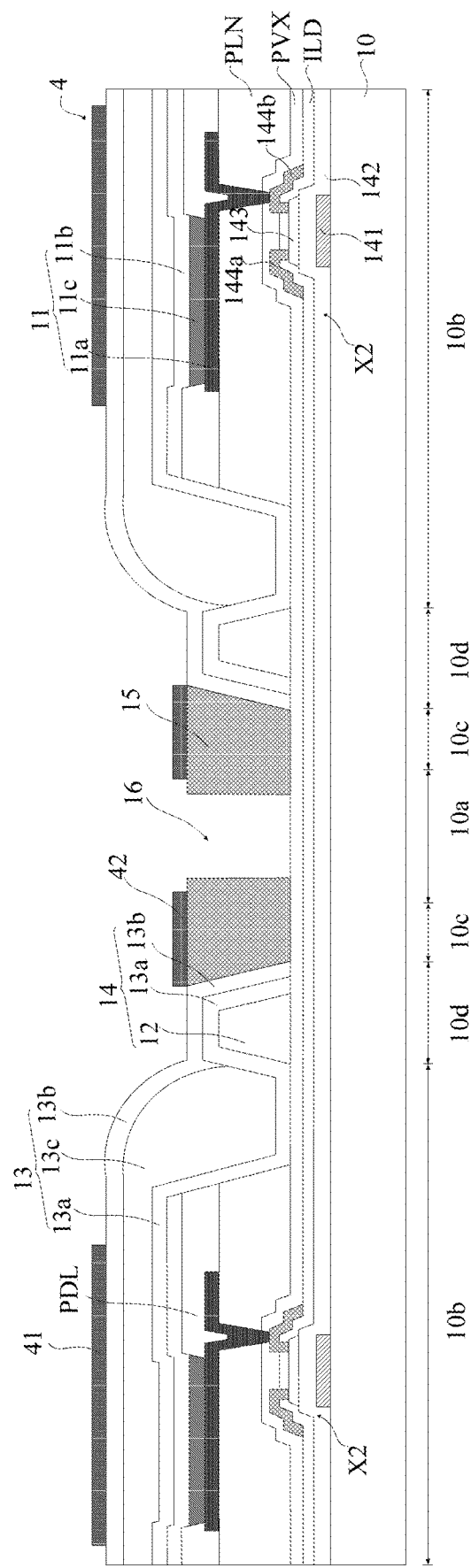
FIG. 12 is a schematic structural diagram of a cross section of a display panel according to still another embodiment of the present application.

FIG. 12 is a schematic structural diagram of a cross section of a display panel according to yet another embodiment of the present application.

Referring to FIG. 12, the structure of a display panel 4 in this embodiment is approximately the same as those of the display panels 1, 2, and 3 in FIG. 1 to FIG. 2, FIG. 9, and FIG. 10, and a difference lies in that: the display panel 4 further includes:
touch electrode layers 41, located on a side of the encapsulation layer 13 that is away from the substrate 10; and
a light shielding layer 42, located on a side of the solid sealant 15 that is away from the substrate 10, where the light shielding layer 42 and at least one of the touch electrode layers 41 are located at the same layer.

There may be a plurality of touch electrode layers 41, and adjacent touch electrode layers 41 are electrically isolated by using an insulating layer. There may be one or more light shielding layers 42. The touch electrode layers 41 may be connected with the light shielding layers 42.

The materials of the light shielding layers 42 and the touch electrode layers 41 may be the same, and may be, for example, Cu, Al, or molybdenum.

The light shielding layer 42 may prevent light leak from a hole provided in the predetermined hole region 10a.

Correspondingly, for the manufacturing method, a difference lies in that: the following operation is performed after step S4: forming the touch electrode layers 41 on a side of the encapsulation layer 13 that is away from the substrate 10, and forming the light shielding layer 42 on a side of the solid sealant 15 that is away from the substrate 10. In other words, the light shielding layer 42 and at least one of the touch electrode layers 41 are formed in the same procedure.

In case of no conflict, the above embodiments can be combined.

Based on the foregoing display panels 1, 2, 3, and 4, an embodiment of the present application further provides a display apparatus. The display apparatus includes:

any one of the display panels 1, 2, 3, and 4;

a photosensitive element, disposed on a back surface of the display panel 1, 2, 3, or 4, and aligned with the predetermined hole region 10*a*.

The photosensitive element may be a camera, a fingerprint sensor, an IR sensor or the like.

The display apparatus may be any product or component that has a display function such as an electronic paper, a mobile phone, a tablet computer, a television, a notebook computer, a digital photo frame, or a navigator.

It is to be noted that in the accompanying drawings, for clarity, dimensions of layers and regions may be exaggerated. In addition, it may be understood that when an element or layer is referred to as being "on" another element or layer, it may be directly on the another element, or an intermediate layer may exist. In addition, it may be understood that when an element or layer is referred to as being "below" another element or layer, it may be directly below the another element, or one or more intermediate layers or elements may exist. In addition, it may further be understood that when a layer or element is referred to as being "between" two layers or two elements, it may be a unique layer between the two layers or two elements, or one or more intermediate layers or elements may further exist Similar reference numerals throughout the specification indicate similar elements.

In the present application, terms "first" and "second" are merely intended for a descriptive purpose and cannot be understood as indicating or implying relative importance.

A person skilled in the art upon consideration of the specification and practice of the present disclosure disclosed herein will readily appreciate other implementations of the present application. The present application is intended to cover any variations, uses, or adaptations of the present application, and the variations, uses, and adaptations follow a general principle of the present application and include common sense or common technical means in this technical field that are not disclosed in the present application. The specification and the embodiments are considered as merely exemplary, and the scope and spirit of the present application are pointed out in the following claims.

It should be noted that the present application is not limited to the precise structures described above and shown in the accompanying drawings, and various modifications and changes can be made without departing from the scope of the present application. The scope of the present application is limited only by the appended claims.

What is claimed is:

1. A display panel, comprising:
   a substrate, comprising a predetermined hole region, a first adjacent region surrounding the predetermined hole region, a second adjacent region surrounding the first adjacent region, and a display region surrounding the second adjacent region;
   a plurality of pixel structures arranged in an array and located in the display region;
   a protruding ring, located in the second adjacent region;
   an encapsulation layer, covering the pixel structures arranged in an array and sides of the protruding ring that are away from the substrate, wherein the protruding ring and a part of the encapsulation layer covering the protruding ring form a dam;
   a solid sealant, filling the first adjacent region and the predetermined hole region that are enclosed by the dam; and
   an opening, located in the solid sealant, and configured to release stress generated by the solid sealant during full curing;
   wherein the first adjacent region is a non-closed ring surrounding the predetermined hole region, the second adjacent region is a non-closed ring surrounding the first adjacent region, and the display region is a non-closed ring surrounding the second adjacent region.

2. The display panel according to claim 1, wherein the opening is located in the predetermined hole region and the opening comprises one or more openings.

3. The display panel according to claim 1, wherein the opening is formed through an entire thickness or a partial thickness of the solid sealant.

4. The display panel according to claim 1, further comprising:
   touch electrode layers, located on a side of the encapsulation layer that is away from the substrate; and
   a light shielding layer, located on a side of the solid sealant that is away from the substrate, wherein the light shielding layer and at least one of the touch electrode layers are located at a same layer.

5. The display panel according to claim 1, wherein the solid sealant is obtained by fully curing a liquid sealant or a semi-solid sealant.

6. The display panel according to claim 5, wherein the semi-solid sealant is a photosensitive material.

7. The display panel according to claim 5, wherein the semi-solid sealant is obtained by semi-curing the liquid sealant.

8. The display panel according to claim 1, wherein the substrate further comprises a third adjacent region, the third adjacent region surrounds the second adjacent region, the display region surrounds the third adjacent region, the encapsulation layer further covers the third adjacent region, and the third adjacent region and/or the first adjacent region is provided with one or more isolation trenches; and
   wherein the one or more isolation trenches penetrate through a gate insulation layer, an interlayer dielectric layer and a passivation layer.

9. A manufacturing method for a display panel, comprising:
   providing a substrate, wherein the substrate comprises a predetermined hole region, a first adjacent region surrounding the predetermined hole region, a second adjacent region surrounding the first adjacent region, and a display region surrounding the second adjacent region;
   forming a plurality of pixel structures arranged in an array in the display region, and forming a protruding ring in the second adjacent region;
   forming an encapsulation layer on the pixel structures arranged in an array and on sides of the protruding ring that are away from the substrate, wherein the protruding ring and a part of the encapsulation layer covering the protruding ring form a dam; and
   filling, with a semi-solid sealant, the first adjacent region and the predetermined hole region that are enclosed by the dam, forming an opening in the semi-solid sealant, and fully curing the semi-solid sealant to form a solid sealant, wherein the opening is configured to release stress generated by the semi-solid sealant during the full curing.

10. The manufacturing method for a display panel according to claim 9, wherein the semi-solid sealant is obtained by semi-curing of a liquid sealant; and both the semi-curing and the full curing are heat curing, and a temperature during the full curing is higher than a temperature during the semi-curing.

11. The manufacturing method for a display panel according to claim 9, wherein the semi-solid sealant is obtained by semi-curing of a liquid sealant; and the semi-curing is ultraviolet curing, and the full curing is heat curing.

12. The manufacturing method for a display panel according to claim 9, wherein the substrate further comprises a third adjacent region, the third adjacent region surrounds the second adjacent region, the display region surrounds the third adjacent region, and the encapsulation layer further covers the third adjacent region,
wherein the method further comprises:
forming, in the first adjacent region and/or the third adjacent region, one or more isolation trenches that penetrate through a gate insulation layer, an interlayer dielectric layer and a passivation layer.

13. The manufacturing method for a display panel according to claim 9, further comprising:
forming touch electrode layers on a side of the encapsulation layer that is away from the substrate; and
forming a light shielding layer on a side of the solid sealant that is away from the substrate;
wherein the light shielding layer and at least one of the touch electrode layers are located at a same layer.

14. The manufacturing method for a display panel according to claim 9, wherein the opening is located in the predetermined hole region and the opening comprises one or more openings.

15. The manufacturing method for a display panel according to claim 9, wherein the opening is formed through an entire thickness or a partial thickness of the solid sealant.

16. The manufacturing method for a display panel according to claim 9, wherein the first adjacent region is a closed ring surrounding the predetermined hole region, the second adjacent region is a closed ring surrounding the first adjacent region, and the display region is a closed ring surrounding the second adjacent region.

17. The manufacturing method for a display panel according to claim 9, wherein the first adjacent region is a non-closed ring surrounding the predetermined hole region, the second adjacent region is a non-closed ring surrounding the first adjacent region, and the display region is a non-closed ring surrounding the second adjacent region.

18. A display apparatus, comprising:
a display panel, comprising:
a substrate, comprising a predetermined hole region, a first adjacent region surrounding the predetermined hole region, a second adjacent region surrounding the first adjacent region, and a display region surrounding the second adjacent region;
a plurality of pixel structures arranged in an array and located in the display region;
a protruding ring, located in the second adjacent region;
an encapsulation layer, covering the pixel structures arranged in an array and sides of the protruding ring that are away from the substrate, wherein the protruding ring and a part of the encapsulation layer covering the protruding ring form a dam;
a solid sealant, filling the first adjacent region and the predetermined hole region that are enclosed by the dam; and
an opening, located in the solid sealant, and configured to release stress generated by the solid sealant during full curing; and
one or more photosensitive elements disposed on a back side of the display panel and aligned with the predetermined hole region;
wherein the first adjacent region is a non-closed ring surrounding the predetermined hole region, the second adjacent region is a non-closed ring surrounding the first adjacent region, and the display region is a non-closed ring surrounding the second adjacent region.

19. The display apparatus according to claim 18, wherein the one or more photosensitive elements comprise at least one of a camera, a fingerprint sensor, or an infrared sensor.

* * * * *